US006509543B1

(12) United States Patent
Muto et al.

(10) Patent No.: US 6,509,543 B1
(45) Date of Patent: Jan. 21, 2003

(54) SEMICONDUCTOR LASER HEATING APPARATUS

(75) Inventors: Yasumichi Muto, Suita (JP); Minoru Yamada, Hyogo (JP); Yoshiya Shiraishi, Hyogo (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/253,594

(22) Filed: Feb. 22, 1999

(30) Foreign Application Priority Data

Mar. 10, 1998 (JP) .......................................... 10-057790

(51) Int. Cl.[7] .......................... B23K 26/00; B23K 26/14
(52) U.S. Cl. ............................. 219/121.62; 219/121.84; 359/187
(58) Field of Search ...................... 219/121.62, 121.84; 359/187; 372/38, 32, 29

(56) References Cited

U.S. PATENT DOCUMENTS

| | | | | |
|---|---|---|---|---|
| 4,166,985 A | * | 9/1979 | White et al. ............. 331/94.5 S |
| 4,249,076 A | * | 2/1981 | Bergstrom et al. ........... 250/227 |
| 5,009,505 A | * | 4/1991 | Malvern ................. 250/227.19 |
| 5,043,745 A | * | 8/1991 | Inoue et al. ................. 346/108 |
| 5,161,044 A | * | 11/1992 | Nazarathy et al. ........... 359/157 |
| 5,184,244 A | * | 2/1993 | Nishimura ................... 359/187 |
| 5,226,051 A | * | 7/1993 | Chan et al. .................... 372/30 |
| 5,285,059 A | * | 2/1994 | Nakata et al. ............... 250/205 |
| 5,392,303 A | * | 2/1995 | Shiozawa et al. .............. 372/32 |
| RE34,972 E | * | 6/1995 | Horiguchi et al. .......... 356/73.1 |
| 5,485,300 A | * | 1/1996 | Daley ......................... 359/180 |
| 5,557,406 A | * | 9/1996 | Taylor et al. ........... 250/227.27 |
| 5,708,673 A | * | 1/1998 | Ikeuchi ........................ 372/38 |
| 5,867,513 A | * | 2/1999 | Sato ............................ 372/32 |
| 5,887,010 A | * | 3/1999 | Arai ............................ 372/38 |
| 5,953,477 A | * | 9/1999 | Wach et al. ................. 385/115 |
| 5,963,357 A | * | 10/1999 | Kubota et al. ............... 359/239 |
| 6,023,357 A | * | 2/2000 | Miyasita ..................... 359/109 |
| 6,078,150 A | * | 6/2000 | Koyanagi et al. ........... 315/309 |

FOREIGN PATENT DOCUMENTS

| | | |
|---|---|---|
| JP | 62-224485 A | 10/1987 |
| JP | 3-95184 A | 9/1991 |
| JP | 3-207586 | 9/1991 |
| JP | 3-230879 | 10/1991 |
| JP | 4-237583 | 8/1992 |
| JP | 8-187585 | 7/1996 |

* cited by examiner

Primary Examiner—Tom Dunn
Assistant Examiner—L. Edmondson
(74) Attorney, Agent, or Firm—Rossi & Associates

(57) ABSTRACT

A semiconductor laser heating apparatus has a measuring instrument for measuring an optical-power output relative to a current to be supplied to the semiconductor laser. The heating apparatus also has a calculator for calculating a correction coefficient of the optical-power output based on the measured data, and has a controller for correcting a supply current to the semiconductor laser relative to a value determined by an optical-power output determiner based on the calculation result. The heating apparatus employing optical fibers as an output terminal thus can always produce a desirable heating condition regardless of the optical-power output deteriorated with the lapse of time.

2 Claims, 3 Drawing Sheets

SEMICONDUCTOR LASER HEATING APPARATUS

FIELD OF THE INVENTION

The present invention relates to a semiconductor-laser-heating-apparatus employing optical fibers as an output terminal, which enables an emitting end of optical fibers to heat a local spot by focusing the optical-power output.

BACKGROUND OF THE INVENTION

A semiconductor laser heating apparatus employing optical fibers has been widely used as a non-contact type heating apparatus for heating a local spot, i.e. optical-power output from an emitting end of the optical fibers is focused to heat a soldering spot, or to peel a cover film off a narrow polyurethane wire.

A conventional semiconductor laser (hereinafter referred to as SL) heating apparatus employing optical fibers as an output terminal is described hereinafter with reference to FIGS. 3 and 4. FIG. 3 is a block diagram illustrating a conventional SL heating apparatus employing optical fibers as an output terminal. SL 1 incorporates photo-receptive end 2b of optical fibers 2. Lens unit 3 incorporates an optical-lens-system that focuses optical-power output emitted from emitting end 2a of optical fiber 2. Constant-current-source-circuit 4 determines a current to be supplied to SL 1. Current detector 5 detects the current supplied to SL 1 using constant-current-source-circuit 4. Optical-power output determiner 6 determines heating output at a desirable value. □Controller 7 adjusts the current to be supplied to SL 1 by controlling constant-current-source-circuit 4 so that a detected value by detector 5 is equal to the value determined by determiner 6. Current amplifier 70f in controller 7 receives the output determined by optical-power output determiner 6 and the current detected by detector 5, then outputs a control signal to circuit 4.

FIG. 4 is a block diagram illustrating another prior art. SL 1 incorporates photo-detector 8. Controller 7 calculates optical-power output from SL 1 using the detected value by photo-detector 8, and adjusts the current to be supplied to SL 1 by controlling constant-current-source-circuit 4 so that the calculated value is equal to the value determined by determiner 6. Current amplifier 70f in controller 7 receives the output determined by optical-power output determiner 6 and the detected value by photo-detector 8, then outputs a control signal to circuit 4.

Operations of the two conventional cases discussed above are described hereinafter.

These two cases operate as follows so that the optical-power output from SL 1 can stay constant. In the conventional case illustrated in FIG. 3, the optical-power output from SL 1 is calculated based on the value detected by current detector 5. Constant-current-source circuit 4 is then controlled such that the calculated output is equal to the value determined by optical-power output determiner 6, whereby the current to be supplied to SL 1 is adjusted. In another conventional case illustrated in FIG. 4, the optical-power output from SL 1 is calculated based on the value detected by photo-detector 8. Constant-current-source-circuit 4 is then controlled such that the calculated output is equal to the value determined by optical-power output determiner 6, whereby the current to be supplied to SL 1 is adjusted. The optical-power output from SL 1 travels through optical fiber 2, is emitted from emitting end 2a, and is focused by lens unit 3, then is finally irradiated to an object. Since this optical-power output from SL 1 has been controlled at a constant level, the object receives a constant volume of optical-power.

As the foregoing description clarifies, in these two prior art, the optical-power output irradiated to the object is controlled so that required heating conditions for the object can be prepared. To be more specific in the prior art of FIG. 3, relative characteristics between the supply current to SL 1 and the optical-power output from lens unit 3 have been found and stored in controller 7. Controller 7 receives the value detected by current detector 5 as well as the value determined by optical-power output determiner 6, and then controls the supply current to SL 1 so that both the values become equal. As a result, the optical-power irradiated to the object becomes a desired heating level.

To be more specific in the other prior art of FIG. 4, relative characteristics between the supply current to SL 1 and the optical-power output from lens unit 3 have been found and stored in controller 7. Controller 7 receives the value detected by photo-detector 8 as well as the value determined by optical-power output determiner 6, and then controls the supply current to SL 1 so that both the values become equal. As a result, the optical-power irradiated to the object becomes a desired heating level.

FIG. 2 is a graph depicting relative characteristics between supply current "I" to SL 1 and optical-power output "P" emitted from optical fiber 2. The graph tells that optical-power output "P" slightly increases in a region where current "I" stays small. When current "I" exceeds a threshold current "$I_{th}$", optical-power output "P" sharply increases almost linearly due to laser effect. An increment rate of optical-power output "P", however, decreases in step with the increase of supply current "I". Such SL heating apparatuses have been used in the region where sufficient optical-power output "P" can be obtained thanks to the laser effect, i.e. the region where the supply current exceeds threshold current value "$I_{th}$" and thus a sufficient heating power can be obtained.

In these conventional SL heating apparatuses employing optical fibers as an output terminal, however, light emitting loss of SL 1 per se as well as loss on a contact face between SL 1 and optical fiber 2 increases with the lapse of operation time. Therefore, optical-power output "P" emitted from optical fiber 2 cannot deliver on what is expected based on the amount of supply current to SL 1.

As such, in order to control optical-power output "P" to be irradiated to an object, optical-power output "P" relative to the supply current to SL 1 needs to be corrected responsive to the frequency of uses and the hours of operations.

SUMMARY OF THE INVENTION

The present invention addresses the problem above and aims to provide a semiconductor laser (SL) heating apparatus that overcomes the problem. Specifically, the SL heating apparatus of the present invention comprises the following elements: a semiconductor laser (SL); a constant current source for supplying a constant current to the SL; an optical-power output determiner for determining the output from the SL at a desired level; a detector for detecting the output from the SL; and a controller for controlling the constant current source so that the detected value corresponds to the determined value defined by the optical-power output determine. The SL heating apparatus further comprises the following elements: an optical fiber coupled to the SL; a measuring instrument of the output emitted from the optical fiber; an output corrector for supplying an output correction signal to the controller when the output emitted from the optical fiber is changed; a constant current determiner for determining a current to be supplied to SL responsive to the correction signal.

According to the construction described above, when the current determined by the constant current determiner is supplied to the SL via the constant current source, the output emitted from the optical fiber is measured by the measuring instrument. Then the controller corrects the current to be supplied to the SL based on the measured output, whereby the optical-power output is corrected.

The construction discussed above allows the SL heating apparatus of the present invention to correct the optical-power output emitted from the optical fiber end relative to the supply current to the SL, because the output has been varied with the lapse of the operation time and needs to be corrected. Therefore, in the region where the supply current exceeds the threshold value, the optical-power output can be corrected, and thus the heating power applied to the object can be corrected to stay constant. As a result, the present invention effects an advantage that a desirable heating condition can be always produced.

DESCRIPTION OF THE PREFERRED EMBODIMENT

An exemplary embodiment of the present invention is described hereinafter with reference to FIG. 1.

Figure 1:
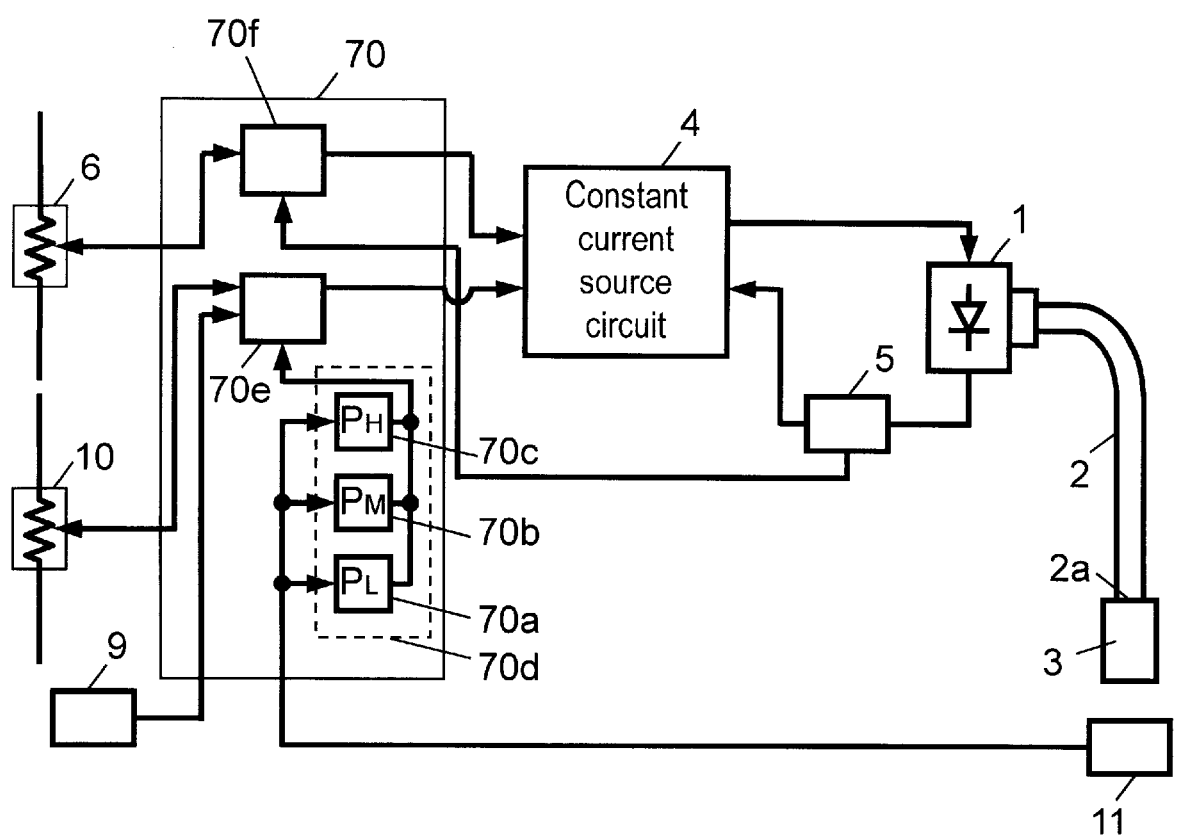
FIG. 1 is a block diagram depicting a semiconductor laser (SL) heating apparatus used in an exemplary embodiment of the present invention.
Figure 3:
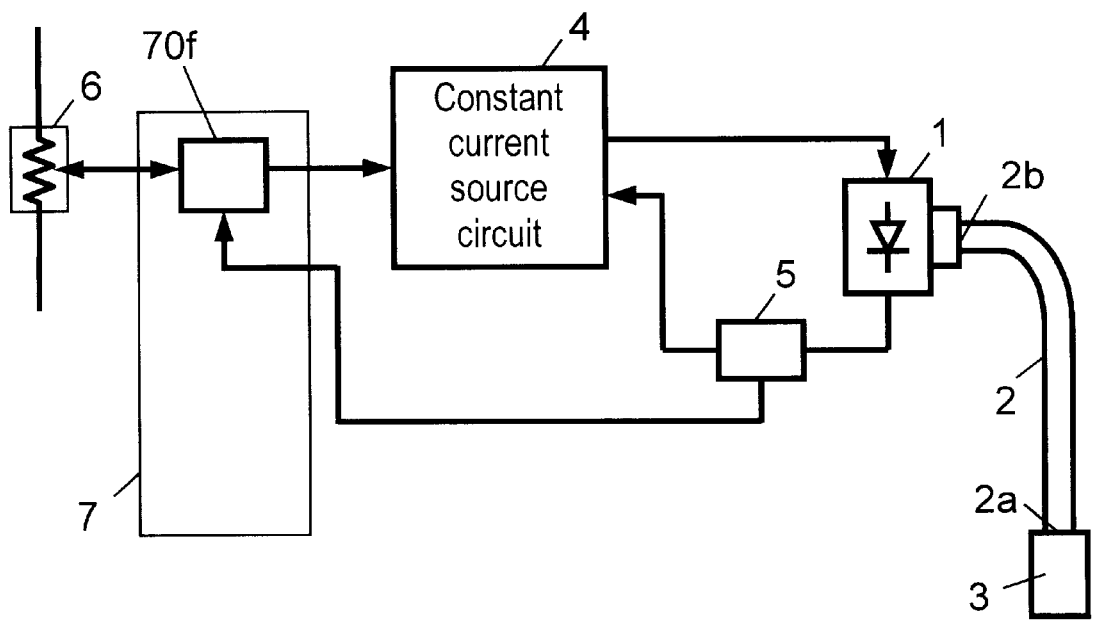
FIG. 3 is a block diagram depicting a conventional SL heating apparatus employing an optical fiber as an output terminal.
Figure 4:
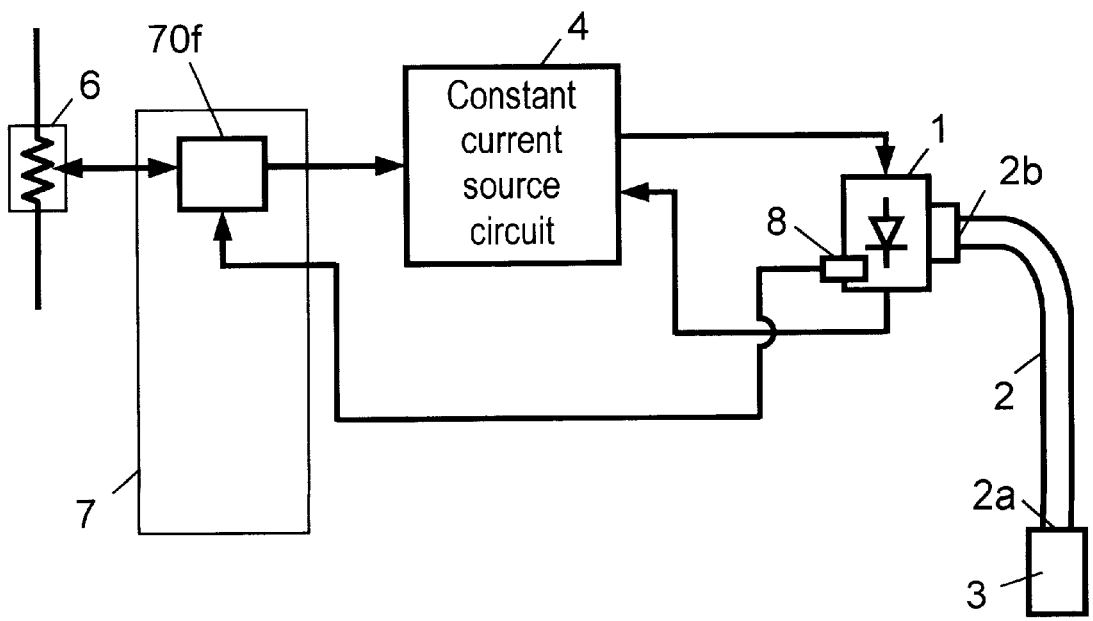
FIG. 4 is a block diagram depicting another conventional SL heating apparatus employing an optical fiber as an output terminal.

The same elements used in FIGS. 3 and 4 are quoted in FIG. 1 with the same marks, and details of these elements are omitted.

Figure 2:
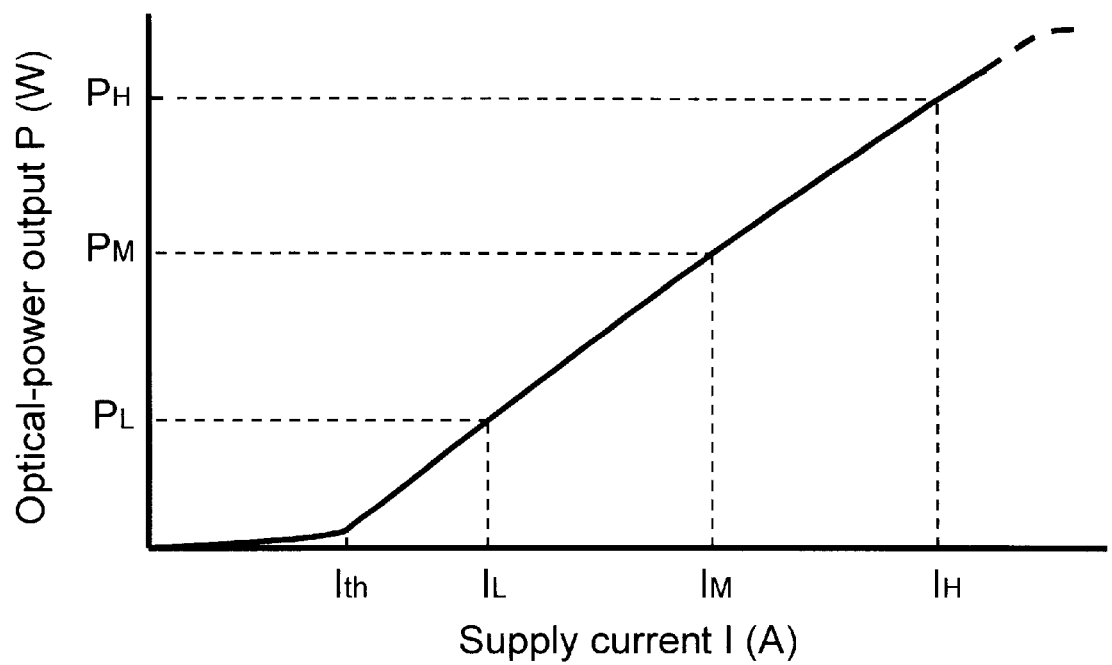
FIG. 2 is a graph depicting relative characteristics between supply current "I" to the SL and optical-power output "P".

In FIG. 1, output corrector 9 supplies a correcting instruction when an optical-power output from lens unit 3 is decreased. When the output of SL 1 is corrected with this instruction, constant current determiner 10 determines at least three different constant-currents to be supplied to SL 1 i.e. $I_L$, $I_M$ and $I_H$ as shown in FIG. 2. Measuring instrument 11 of the optical-power output measures optical-power outputs $P_L$, $P_M$ and $P_H$ supplied from lens unit 3 and corresponding to respective current values $I_L$, $I_M$ and $I_H$. Memories 70a, 70b and 70c, elements of data retainer 70d of controller 70, store optical-power outputs $P_L$, $P_M$ and $P_H$.

How to correct the optical-power output in the SL heating apparatus having the construction discussed above is described hereinafter.

In the case when the optical-power output from lens unit 3 is decreased due to deterioration with age of SL 1, output corrector 9 supplies an output correcting signal. Then, pre-determined current $I_L$, $I_M$ and $I_H$ different one another are sequentially supplied to SL 1 via controller 70 and constant-current-source-circuit 4. When circuit 4 supplies first determined current $I_L$ in FIG. 2 to SL 1, optical-power output $P_L$ from lens-unit 3 travels through measuring instrument 11 of optical-power output. Memory 70a of controller 70 retains optical-power output data $P_L$.

After supplying first determined current $I_L$ to SL 1, circuit 4 supplies second determined current $I_M$ to SL 1, and in the same manner as the first case, memory 70b of controller 70 retains optical-power output data $P_M$.

Circuit 4 also supplies third determined current $I_H$ to SL 1, and memory 70c of controller 70 retains optical-power output data $P_H$ same as the cases discussed above.

These optical-power output data are stored in respective memories 70a, 70b and 70c of controller 70 until they are updated when the outputs are corrected next time.

Controller 70 has calculator 70e, which performs the following calculations using optical-power output-data $P_L$, $P_M$ and $P_H$ stored in memories 70a, 70b and 70c.

The relation between optical-power output P and supply current I is expressed with the following equation (1) in the region where supply current I is smaller than determined current $I_M$.

$$P=\{(P_M-P_L)/(I_M-I_L)\}\cdot(I-I_{th}) \qquad (1)$$

where: P=optical-power output, $I_M$ and $I_L$=pre-determined currents to be supplied ($I_L<I_M$), $I_{th}$=threshold current, $P_L$=an optical-power output at supplied current $I_L$, and $P_M$=an optical-power output at supplied current $I_M$.

The relation between optical-power output P and supply current I is expressed with the following equation (2) in the region where supply current I is greater than determined current $I_M$.

$$P=\{(P_H-P_M)/(I_H-I_M)\}\cdot(I-I_M)+P_M \qquad (2)$$

where: P=optical power output, $I_H$ and $I_M$=pre-determined current to be supplied ($I_M<I_H$), $P_M$=an optical-power output at supplied current $I_M$, and $P_H$=an optical-power output at supplied current $I_H$.

Threshold current $I_{th}$ is calculated by calculator 70e using equation (1) where P=$P_L$, I=$I_L$, or P=$P_M$, I=$I_M$. When the supplied current is greater than threshold current $I_{th}$, optical-power output P can effect heating.

As such, controller 70 receives an instruction from output corrector 9, and has calculator 70e determine the current to be supplied to SL 1 using equation (1) or (2) in the region where the supply current is greater than threshold current $I_{th}$. The optical-power output from lens unit 3 is thus corrected.

According to the present invention, as discussed above, the optical-power output, which is emitted from the optical fiber end, relative to the supply current to the SL is corrected because the output has been deteriorated with the lapse of time. An optical-power output is corrected relative to the supply current exceeding the threshold current so that the heating power to the object can be kept at a constant level. As a result, an excellent SL heating apparatus always producing the desirable heating condition can be provided.

What is claimed is:

1. A method for controlling a semiconductor laser heating apparatus comprising:
   (a) generating optical power with a semiconductor laser (SL);
   (b) supplying a supply current signal to said SL with a constant current source;
   (c) selecting an optical-power signal output from said SL at a desired optical-power signal level;

(d) detecting a detected supply current signal level of the supply current signal output from said SL;

(e) controlling said constant current source with a controller so that the detected supply current signal level corresponds to the desired optical-power signal level;

(f) transmitting optical power with an optical fiber having a photo receptive end and an emitting end with the photo receptive end coupled to said SL;

(g) measuring an emitted optical-power level output from the emitting end of said optical fiber with a measuring instrument;

(h) supplying an output correction signal to said controller when a change in the emitted optical-power signal level occurs;

(i) determining at least one pre-determined supply current signal level to be supplied to said SL responsive to the output correction signal;

(j) retaining data measured by said measuring instrument of the emitted optical-power signal level with a data retainer; and (k) calculating with a calculator a correction coefficient of the desired optical-power signal level based on the pre-determined supply current signal level and the emitted optical-power signal level;

wherein, said measuring instrument measures the emitted optical-power signal level when at least one pre-determined supply current signal level is supplied to said SL via said constant current source, then based on the measured emitted optical-power signal level, said controller corrects the supply current signal level to said SL to compensate the emitted optical-power signal level to equal the desired optical-power signal level;

wherein said semiconductor laser heating apparatus corrects the supply current signal level to be supplied to said SL to compensate the emitted optical-power signal level to equal the desired optical-power value based on a calculation result of said calculator; and wherein said calculator calculates, based on data stored in said data retainer, a relation between the desired optical-power signal level and the supply current signal level to be supplied to said SL using equation (1) when the supply current signal level is smaller than the predetermined supply current signal level $I_M$ and using equation (2) when the supply current signal level is greater than the pre-determined supply current signal level $I_M$; and wherein equation (1) comprises:

$$P = \{(P_M - P_L)/(I_M - I_L)\} \cdot (I - I_{th})$$

where: P=a desired optical power signal level,
I=a supply current signal level,
$I_{th}$=threshold supply current signal level,
$I_M$ and $I_L$=pre-determined supply current signal levels ($I_L < I_M$),
$P_L$=an emitted optical-power signal level output at pre-determined supply current signal level $I_L$, and
$P_M$=an emitted optical-power signal level output at predetermined supply current signal level $I_M$; and wherein equation (2) comprises:

$$P\{(P_H - P_M)/(I_H - I_M)\} \cdot (I - I_M) + P_M$$

where: P=a desired optical power signal level,
I=a supply current signal level,
$I_H$ and $I_M$=pre-determined supply current signal levels ($I_M < I_H$),
$P_M$=an emitted optical-power signal level output at pre-determined supply current signal level $I_M$, and
$P_H$=an emitted optical-power signal level output at pre-determined supply current signal level $I_H$.

2. The method for controlling a semiconductor laser heating apparatus as defined in claim 1, wherein said calculator calculates a threshold current $I_{th}$ of said SL based on the data stored in said data retainer with the equation (1) where one of $P=P_L$, $I=I_L$ and $P=P_M$, $I=I_M$ are substituted.

* * * * *